United States Patent
Knight et al.

(10) Patent No.: US 7,180,741 B1
(45) Date of Patent: Feb. 20, 2007

(54) SPRAY COOL SYSTEM WITH A DRY ACCESS CHAMBER

(75) Inventors: Paul A. Knight, Spokane, WA (US); Brent M. Fales, Clarkston, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 139 days.

(21) Appl. No.: 10/649,328

(22) Filed: Aug. 26, 2003

(51) Int. Cl.
*H05K 7/20* (2006.01)
*F28F 7/00* (2006.01)
*H02G 3/03* (2006.01)
*H01L 23/34* (2006.01)
*F25D 17/02* (2006.01)

(52) U.S. Cl. .................. 361/699; 165/80.4; 165/80.5; 174/15.1; 174/252; 257/714; 62/64; 62/259.2

(58) Field of Classification Search ........ 361/679–727; 62/64, 259.2
See application file for complete search history.

(56) References Cited

U.S. PATENT DOCUMENTS

| 3,406,244 | A | 10/1968 | Oktay | 174/15 |
|---|---|---|---|---|
| 4,399,484 | A | 8/1983 | Mayer | 361/382 |
| 4,493,010 | A | 1/1985 | Morrison et al. | 361/385 |
| 4,912,600 | A | 3/1990 | Jaeger et al. | 361/385 |
| 4,967,829 | A | 11/1990 | Albers et al. | 165/1 |
| 5,057,968 | A | 10/1991 | Morrison | 361/385 |
| 5,177,666 | A | 1/1993 | Bland et al. | 361/382 |
| 5,220,804 | A | 6/1993 | Tilton et al. | 62/64 |
| 5,293,754 | A | 3/1994 | Mizuno | 62/185 |
| 5,314,529 | A | 5/1994 | Tilton et al. | 96/204 |
| 5,675,473 | A | 10/1997 | McDunn et al. | 361/699 |
| 5,718,117 | A | 2/1998 | McDunn et al. | 62/64 |
| 5,740,018 | A | 4/1998 | Rumbut, Jr. | 361/720 |
| 5,831,824 | A | 11/1998 | McDunn et al. | 361/699 |
| 5,854,092 | A | 12/1998 | Root et al. | 438/106 |
| 5,880,931 | A | 3/1999 | Tilton et al. | 361/690 |

(Continued)

FOREIGN PATENT DOCUMENTS

EP 0 091 733 1/1983

(Continued)

OTHER PUBLICATIONS

High-Performance COTS DSP for Harsh Environment VME Electronics, Tilton, Donald E. et al., COTS Journal, May/Jun. 1999.

(Continued)

*Primary Examiner*—Lisa Lea-Edmonds
*Assistant Examiner*—Zachary Pape
(74) *Attorney, Agent, or Firm*—Michael S. Neustel (57) ABSTRACT

A spray cool system with a dry access chamber for providing convenient access to specific spray system components in a dry chamber separate from the wet chamber. The spray cool system with a dry access chamber includes a chassis having a dry chamber and a wet chamber. A dry access door and a wet access door are removably attached about the dry chamber and the wet chamber respectively for providing access to the same. Spray cool components such as a card cage and a spray unit are positioned within the wet chamber. Spray cool components such as but not limited to filters, pumps, heaters, sensors, separators and the like are positioned within the dry chamber for efficient dry access.

27 Claims, 9 Drawing Sheets

U.S. PATENT DOCUMENTS

| | | | |
|---|---|---|---|
| 5,907,473 A * | 5/1999 | Przilas et al. | 361/699 |
| 5,943,211 A | 8/1999 | Havey et al. | 361/699 |
| 5,999,404 A | 12/1999 | Hileman | 361/699 |
| 6,055,157 A | 4/2000 | Bartilson | 361/699 |
| 6,060,966 A * | 5/2000 | Tennant et al. | 333/202 |
| 6,108,201 A | 8/2000 | Tilton et al. | 361/689 |
| 6,139,361 A | 10/2000 | Przilas et al. | 439/559 |
| 6,349,554 B2 | 2/2002 | Patel et al. | 62/259.2 |
| 6,392,891 B1 | 5/2002 | Tzlil et al. | 361/719 |
| 6,421,240 B1 | 7/2002 | Patel | 361/699 |
| 6,447,270 B1 | 9/2002 | Schmidt et al. | 417/366 |
| 6,452,788 B1 * | 9/2002 | Crowley | 361/683 |
| 6,496,375 B2 | 12/2002 | Patel et al. | 361/719 |
| 6,604,370 B2 | 8/2003 | Bash et al. | 62/171 |
| 6,621,707 B2 | 9/2003 | Ishimine et al. | 361/721 |
| 6,625,023 B1 | 9/2003 | Morrow et al. | 361/700 |
| 6,646,879 B2 | 11/2003 | Pautsch | 361/699 |
| 7,043,933 B1 * | 5/2006 | Knight | 62/259.2 |
| 2005/0001334 A1 * | 1/2005 | Roberts et al. | 261/36.1 |
| 2005/0252024 A1 * | 11/2005 | Knight et al. | 34/202 |

FOREIGN PATENT DOCUMENTS

| | | | |
|---|---|---|---|
| JP | 61267369 | | 11/1986 |
| JP | 02024531 | | 1/1990 |
| WO | WO 01/01741 | * | 1/2001 |
| WO | WO 01/01741 A1 | | 1/2001 |

OTHER PUBLICATIONS

Mist Cooling for Harsh Environment VME, Tilton, Donald E. et al., RTC Magazine, May 1999.
Applying Mist to COTS Convection Modules Is Really Cool, Tilton, Charles, COTS View, 2000.
Spray Cooling for the 3-D Cube Computer, Tilton, Donald E. et al., InterSociety Conference, May 1994.
Spray Cooling Electrical and Electronic Equipment, Tilton, COTS Journal, Nov. 2003.
Parker Advanced Liquid Cooling Systems Team, Parker Aerospace, May 13, 2003.

* cited by examiner

SPRAY COOL SYSTEM WITH A DRY ACCESS CHAMBER

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to spray cool thermal management systems and more specifically it relates to a spray cool system with a dry access chamber for providing convenient access to specific spray system components in a dry chamber separate from the wet chamber.

2. Description of the Related Art

Modern electronic devices have increased thermal management requirements. Conventional dry thermal management technology simply is not capable of efficiently cooling modern high-end electronics.

Spray thermal management technology is being adopted today as the most efficient option for thermally managing electronic systems. U.S. Pat. No. 5,220,804 entitled High Heat Flux Evaporative Spray Cooling to Tilton et al. describes the earlier versions of spray technology. U.S. Pat. No. 6,108,201 entitled Fluid Control Apparatus and Method for Spray Cooling to Tilton et al. also describes the usage of spray technology to cool a printed circuit board. Spray thermal management may be performed locally (i.e. where the chip is sprayed directly), globally (i.e. where the chip and surrounding electronics/boards are also sprayed), a combination of locally and globally, or in conjunction with air cooling or other cooling methods. In a spray thermal management system, most if not all of the spray components are contained within the spray chassis such as but not limited to the spray unit, the card cage, valves, pumps, filters, separators and the like.

While there are many benefits in utilizing spray technology, there are some detriments. A significant problem with conventional spray technology is that to replace, repair or test any electronic device the seal must be broken to the spray chassis thereby leading to the loss of coolant. A further problem with conventional spray technology is that when accessing the components, the user will often times come in direct contact with coolant. Another problem with conventional spray technology is that it requires all of the components to be coolant tolerant thereby increasing the overall cost of the spray cool unit. Another problem with conventional spray technology is that many of the dielectric cooling fluids absorb moisture from ambient air resulting in a risk of electrical shorting spray cooled electrical components.

While these devices may be suitable for the particular purpose to which they address, they are not as suitable for providing convenient access to specific spray system components in a dry chamber separate from the wet chamber. Conventional spray cool systems do not have a separate dry chamber for providing convenient access to spray system components such as pumps, filters, heaters, separators, sensors and the like.

In these respects, the spray cool system with a dry access chamber according to the present invention substantially departs from the conventional concepts and designs of the prior art, and in so doing provides an apparatus primarily developed for the purpose of providing convenient access to specific spray system components in a dry chamber separate from the wet chamber.

BRIEF SUMMARY OF THE INVENTION

In view of the foregoing disadvantages inherent in the known types of spray cool systems now present in the prior art, the present invention provides a new spray cool system with a dry access chamber construction wherein the same can be utilized for providing convenient access to specific spray system components in a dry chamber separate from the wet chamber.

The general purpose of the present invention, which will be described subsequently in greater detail, is to provide a new spray cool system with a dry access chamber that has many of the advantages of the spray cool systems mentioned heretofore and many novel features that result in a new spray cool system with a dry access chamber which is not anticipated, rendered obvious, suggested, or even implied by any of the prior art spray cool systems, either alone or in any combination thereof.

To attain this, the present invention generally comprises a chassis having a dry chamber and a wet chamber. A dry access door and a wet access door are removably attached about the dry chamber and the wet chamber respectively for providing access to the same. Spray cool components such as a card cage and a spray unit are positioned within the wet chamber. Spray cool components such as but not limited to filters, pumps, heaters, sensors, separators and the like are positioned within the dry chamber for efficient dry access.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a spray cool system with a dry access chamber that will overcome the shortcomings of the prior art devices.

A second object is to provide a spray cool system with a dry access chamber for providing convenient access to specific spray system components in a dry chamber separate from the wet chamber.

Another object is to provide a spray cool system with a dry access chamber that reduces coolant loss by reducing the required access to the spray chamber.

An additional object is to provide a spray cool system with a dry access chamber that eliminates the need for a user to come in contact with coolant when accessing specific spray system components.

A further object is to provide a spray cool system with a dry access chamber that provides a location for components that are not compatible with spray cooling fluid.

Another object is to provide a spray cool system with a dry access chamber that reduces the amount of time required to make repairs to specific spray system components.

Another object is to provide a spray cool system with a dry access chamber that provides environmental isolation for the components within a dry chamber.

Another object is to provide a spray cool system with a dry access chamber that reduces the introduction of water into the cooling fluid and prolongs the life of water removing filters.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Turning now descriptively to the drawings, in which similar reference characters denote similar elements throughout the several views, FIGS. 1 through 9 illustrate a spray cool system with a dry access chamber 10, which comprises a dry access chamber includes a chassis 20 having a dry chamber 50 and a wet chamber 60. A dry access door 22 and a wet access door 24 are removably attached about the dry chamber 50 and the wet chamber 60 respectively for providing access to the same. Spray cool components such as a card cage 32 and a spray unit 30 are positioned within the wet chamber 60. Spray cool components such as but not limited to filters 39, pumps, heaters 33, sensors 31, separators 38 and the like are positioned within the dry chamber 50 for efficient dry access.

B. Chassis

The chassis 20 may have various shapes, structures and configurations. The chassis 20 illustrated in the drawings should not be interpreted to limit the scope of protection of the present invention.

As shown in FIGS. 1 through 3 and 6 through 9 of the drawings, the chassis has a wet chamber 60 and a dry chamber 50. The dry chamber 50 includes a coolant system fluidly connected to the wet chamber 60 for providing pressurized liquid coolant (dielectric or non-dielectric). The dry chamber 50 is environmentally isolated and conducts heat generated within the walls of chassis 20.

The wet chamber 60 is for thermally managing an electronic device by applying liquid coolant to an electronic device within the wet chamber 60. The wet chamber 60 and the dry chamber 50 are preferably adjacent to one another within the chassis 20 in a sealed manner to prevent coolant from escaping the wet chamber 60 and entering the dry chamber 50. Various configurations may be utilized to provide easy access to the dry chamber 50.

C. Access Doors

Figure 4:
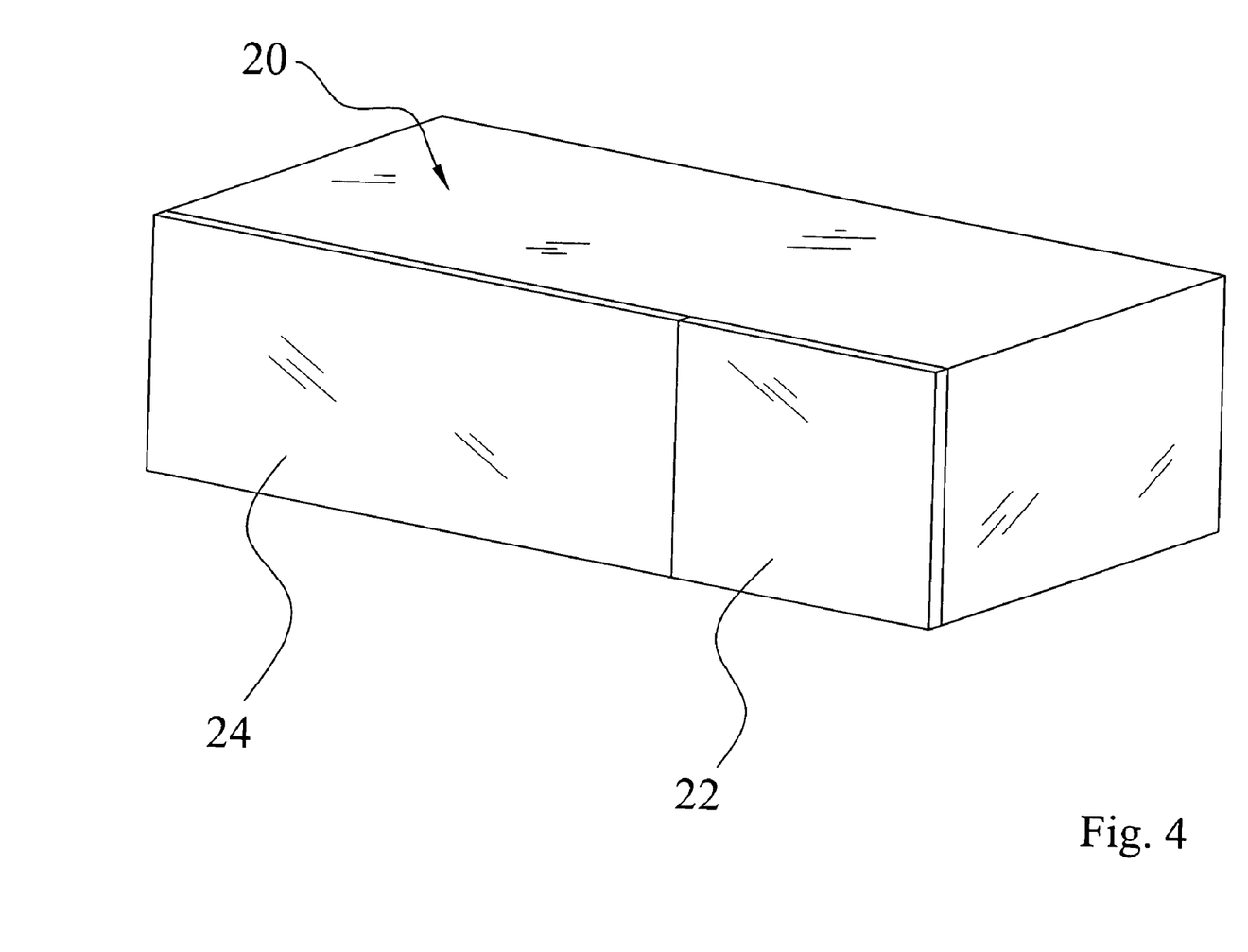
FIG. 4 is a perspective view of the present invention with the dry access door and the wet access door closed.
Figure 5:
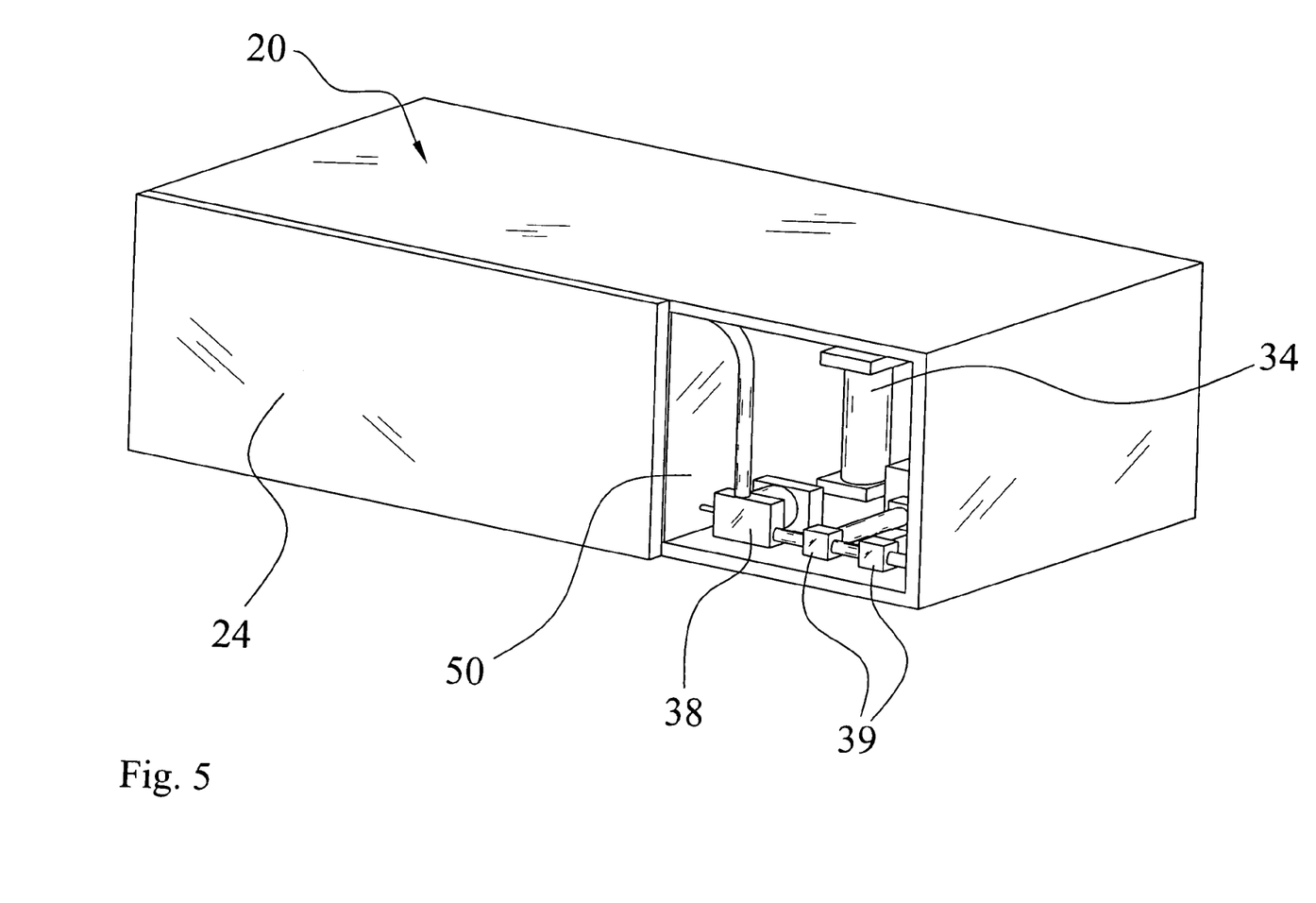
FIG. 5 is a perspective view of the dry access door removed exposing the dry chamber.
Figure 6:
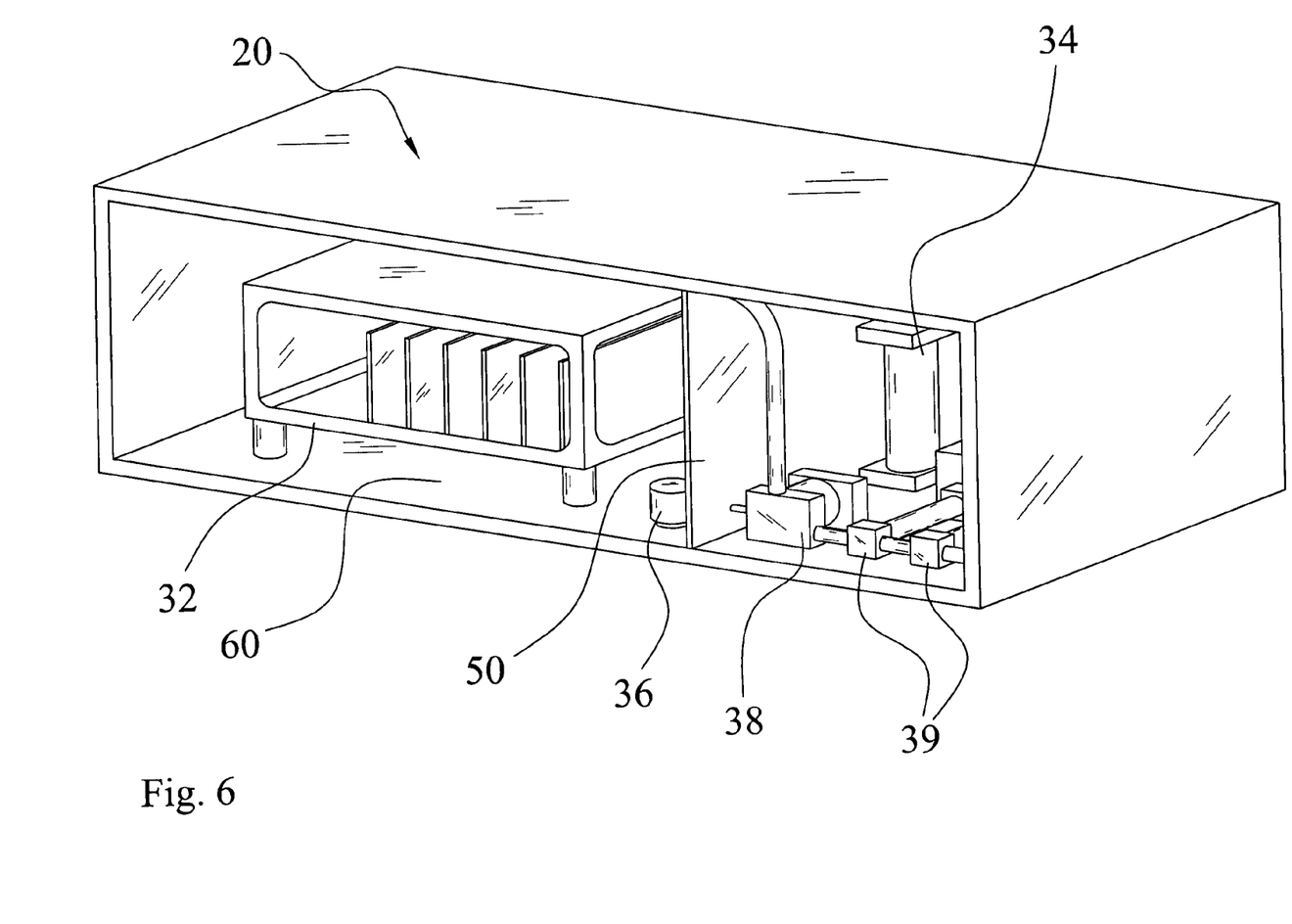
FIG. 6 is a right perspective view of the present invention with the dry access door and the wet access door removed thereby exposing the dry chamber and the wet chamber.
Figure 7:
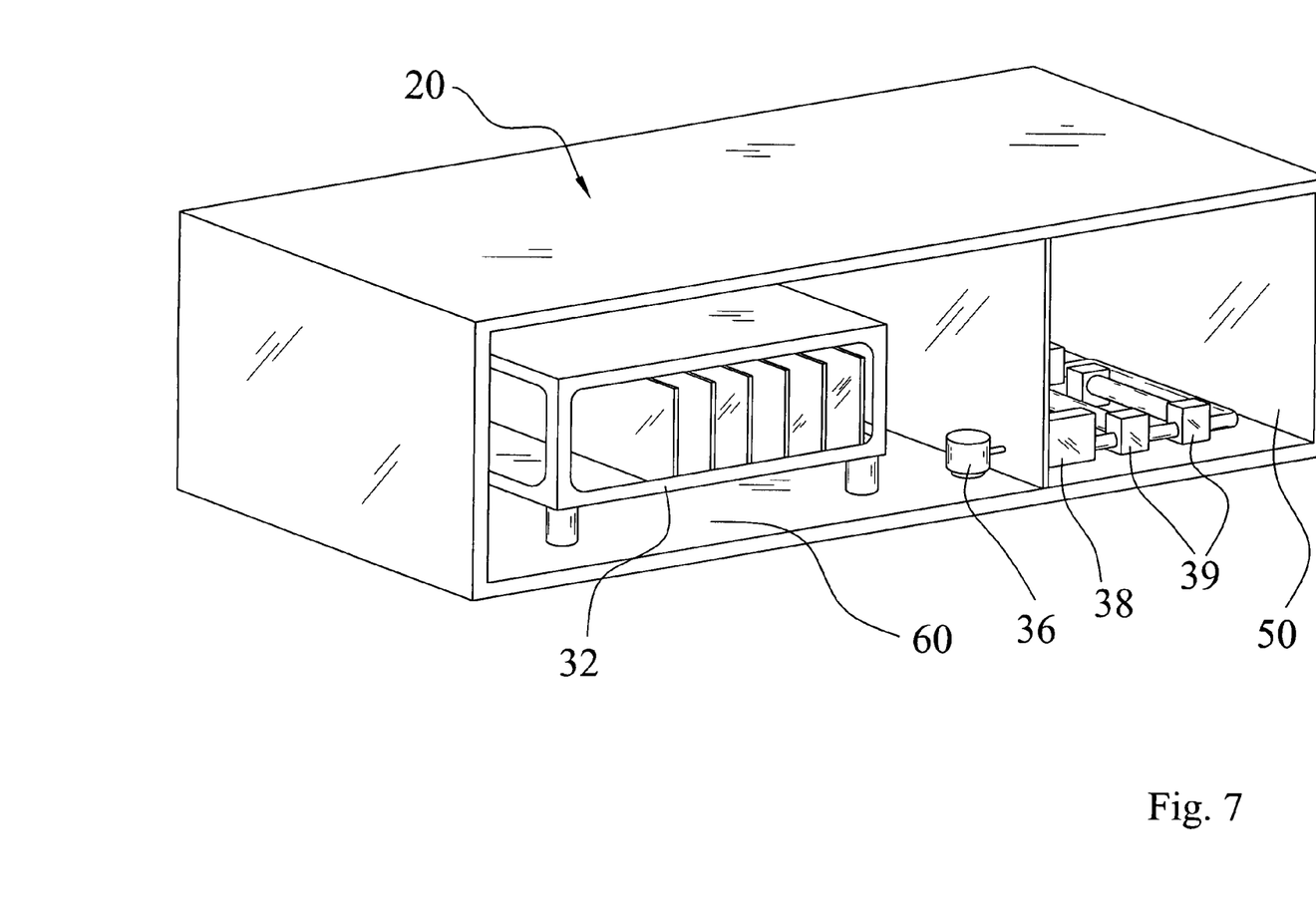
FIG. 7 is a left perspective view of the present invention with the dry access door and the wet access door removed thereby exposing the dry chamber and the wet chamber.
Figure 8:
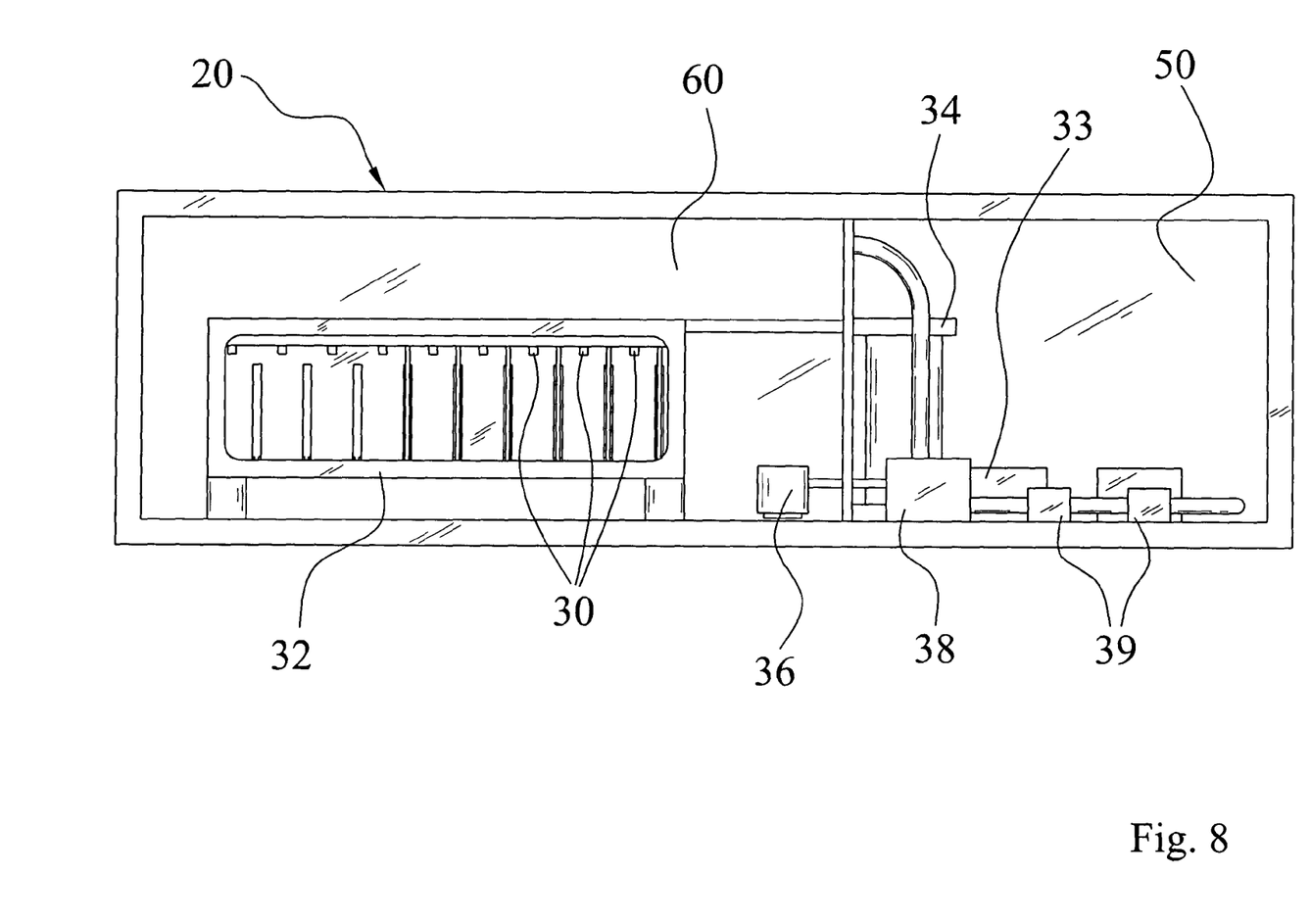
FIG. 8 is a front view of the present invention with the access doors removed.
Figure 9:
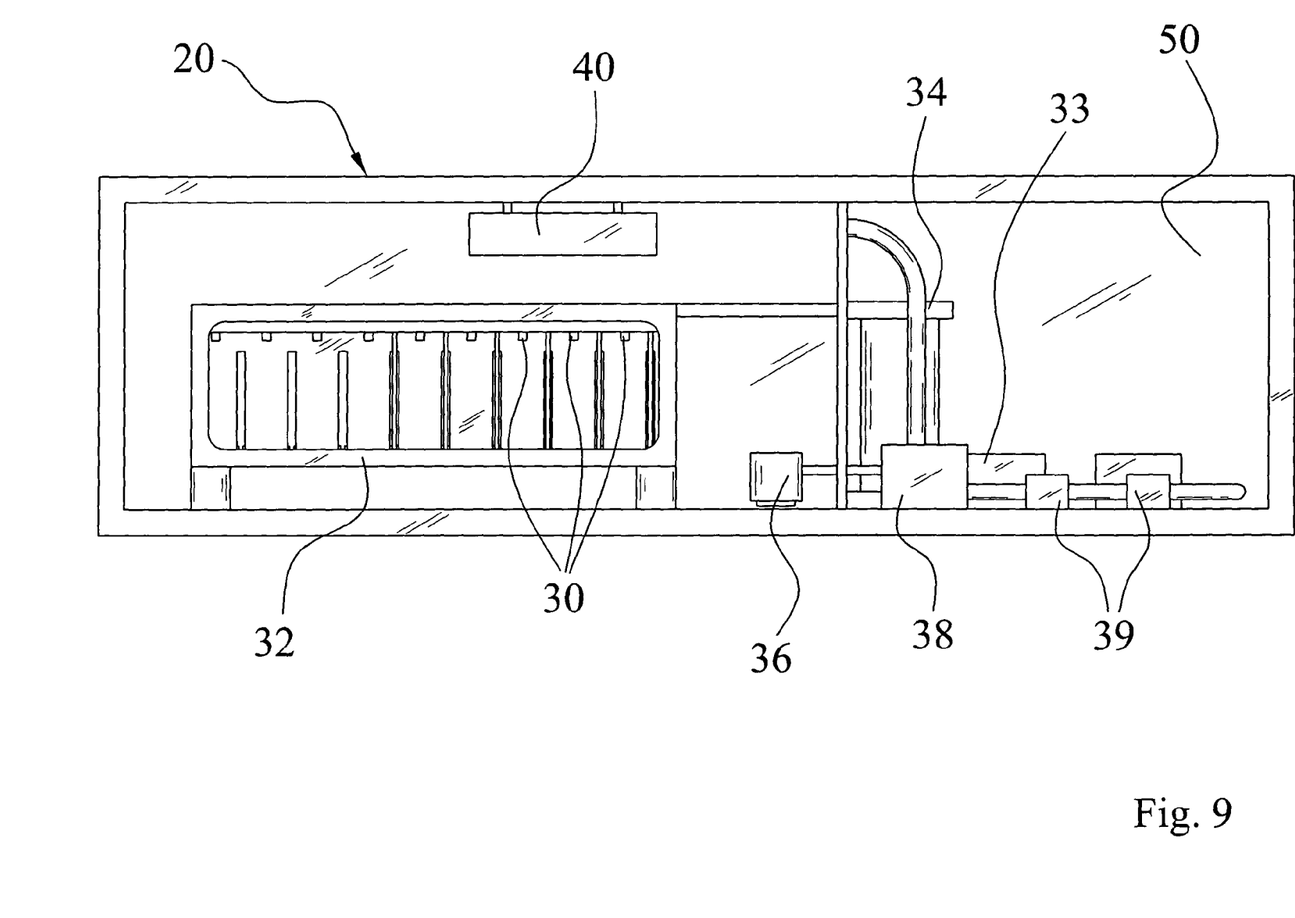
FIG. 9 is a front view of the present invention with a condenser within the wet chamber.

As shown in FIGS. 4 and 5 of the drawings, a wet access door 24 is removably attached about the wet chamber 60 for selectively sealing and opening the wet chamber 60. The wet access door 24 preferably includes a seal structure for sealing the wet access door 24 about the wet chamber 60. The wet access door 24 may be pivotally attached or removably attached to the chassis 20. Various fasteners may be utilized to secure the wet access door 24 to the chassis 20 to close the wet chamber 60.

As shown in FIGS. 1 through 4 of the drawings, a dry access door 22 is removably attached about the dry chamber 50 for selectively sealing and opening the dry chamber 50. The dry access door 22 preferably includes a seal structure for sealing the dry access door 22 about the dry chamber 50. The seal of dry chamber 50 keeps the contents of dry chamber 50 isolated from potentially harsh ambient conditions such as but not limited to electromagnet interference (EMI), water, salt water, chemicals, chemical warfare agents and the like.

Figure 1:
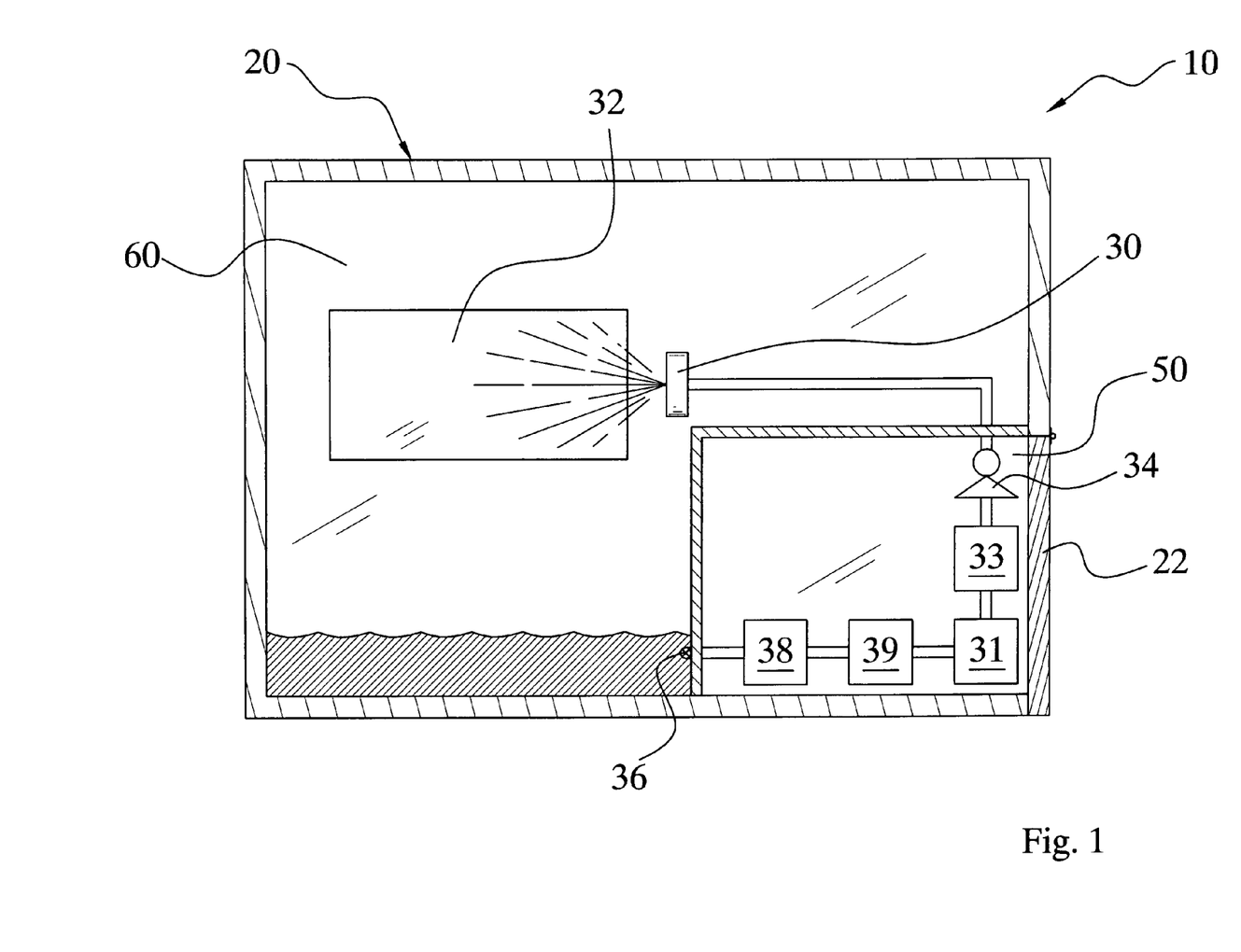
FIG. 1 is a side view of the present invention.
Figure 2:
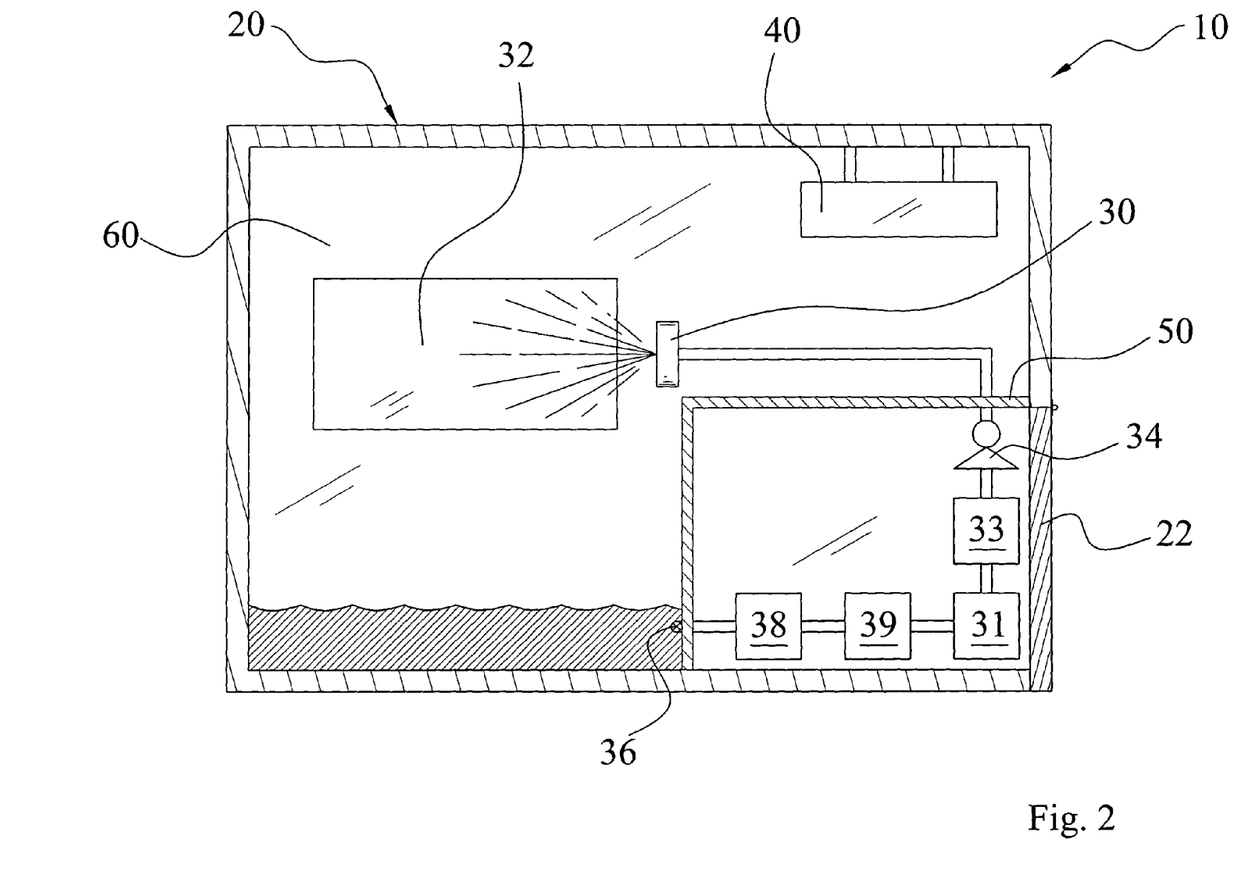
FIG. 2 is a side view of the present invention with a condenser positioned within the wet chamber.
Figure 3:
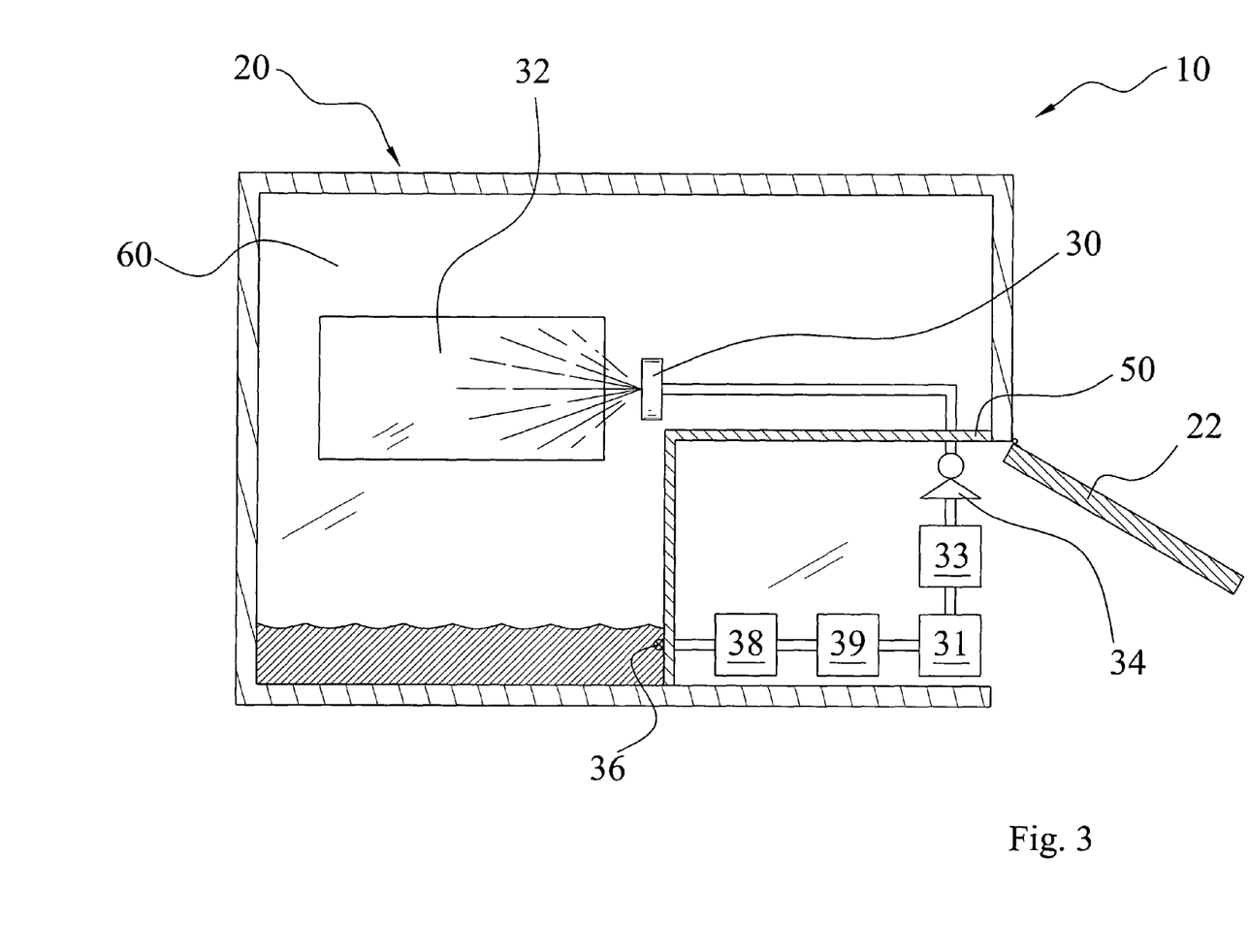
FIG. 3 is a side view of the present invention with the dry access door opened.

The dry access door 22 may be pivotally attached (as shown in FIGS. 1 through 3) or removably attached (as shown in FIGS. 4 and 5) to the chassis 20. Various fasteners may be utilized to secure the dry access door 22 to the chassis 20 to close the dry chamber 50.

D. Coolant System

As stated previously, the dry chamber 50 stores the coolant system. The coolant system is fluidly connected to a spray unit 30 positioned within the wet chamber 60 as shown in FIGS. 1 through 3 of the drawings.

The coolant system is capable of thermally conditioning and filtering the return coolant prior to returning the same to the spray unit 30. The coolant system may include but is not limited to a filter 39, a pump, a heater 33, a sensor and/or a separator 38 as shown in FIGS. 1 through 3 of the drawings. Access to the coolant system is achieved by removing the dry access door 22 without having to disturb the seal of the wet access door 24 to the wet chamber 60.

When an individual opens the wet chamber 60, moisture is introduced into the spray system which many dielectric cooling fluids, such as FLOURINERT®, absorb. Moisture within the cooling fluid presents a risk to performance of the electrical systems within wet chamber 60 by electrical shorting electrical components. The filter 39 is used to remove water from the cooling fluid. The filter 39 must be replaced within a period that is a function of the number of times, and length of time, that the cooling fluid is exposed to the ambient air. The dry chamber 50 decreases the number of times the wet chamber 60 is accessed thereby increasing the period of time between filter replacements and decreasing the risk of electrical shorts within the system.

E. Coolant Spray System

As stated previously, the wet chamber 60 stores the coolant spray system. The coolant spray system is fluidly connected to the coolant system within the dry chamber 50. The coolant spray system may include but is not limited to a spray unit 30, a sensor, a card cage 32, an intake valve 36 and/or a condenser 40. Various well-known coolant spray systems may be utilized within the wet chamber 60.

F. Operation of Invention

In use, the intake valve 36 within the wet chamber 60 draws the return coolant through a separator 38 and/or filters 39 as shown in FIGS. 1 through 3 of the drawings. The coolant is then passed through sensors 31 which determine the condition of the coolant (e.g. temperature, contamination, etc.). The coolant may then be passed through a heater 33 and/or a heat exchanger for thermal conditioning of the coolant to a desired temperature. The coolant is then passed through a pump unit 34 which forces the coolant to the spray unit 30 for dispersing the coolant upon the electronic devices within the wet chamber 60 as shown in FIGS. 1 through 3 of the drawings. A condenser 40 within the wet chamber 60 assists in returning any coolant vapor to a liquid state as shown in FIG. 2 of the drawings.

If the user requires access to a component within the coolant system, the user simply opens or removes the dry access door 22 as shown in FIGS. 3 and 5 of the drawings. The user is then able to access the components of the coolant system without disrupting the seal to the wet chamber 60. In addition, while the user is accessing the dry chamber 50, the coolant system and coolant spray system may continue operation without being disturbed.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A spray cool system with a dry access chamber, comprising:
    a chassis having a wet chamber and a dry chamber, wherein said wet chamber is for thermally managing an electronic device by applying liquid coolant to an electronic device within said wet chamber;
    wherein said dry chamber abuts a sidewall of said chassis;
    a dry access door removably attached about said dry chamber, wherein said dry access door completely seals said dry chamber; and
    a wet access door removably attached about said wet chamber, wherein said wet access door completely seals said wet chamber.

2. The spray cool system with a dry access chamber of claim 1, wherein said wet chamber includes a coolant spray system.

3. The spray cool system with a dry access chamber of claim 2, wherein said coolant spray system is comprised of components chosen from the group consisting of a spray unit, a sensor, a card cage, an intake valve and a condenser.

4. The spray cool system with a dry access chamber of claim 3, wherein said coolant spray system is fluidly connected to a coolant system positioned within said dry chamber.

5. The spray cool system with a dry access chamber of claim 1, wherein said dry chamber includes a coolant system fluidly connected to said wet chamber.

6. The spray cool system with a dry access chamber of claim 5, wherein said coolant system is fluidly connected to a spray unit positioned within said wet chamber.

7. The spray cool system with a dry access chamber of claim 5, wherein said coolant system is comprised of components chosen from the group consisting of a filter, a pump, a heater, a sensor and a separator.

8. The spray cool system with a dry access chamber of claim 1, wherein said dry chamber is adjacent to said wet chamber within said chassis.

9. The spray cool system with a dry access chamber of claim 1, wherein said dry chamber is sealed from said wet chamber.

10. The spray cool system with a dry access chamber of claim 1, wherein said dry access door is movably or pivotally attached to said chassis.

11. The spray cool system with a dry access chamber of claim 1, wherein said dry access door is pivotally attached to said chassis.

12. A spray cool system with a dry access chamber, comprising:
    a chassis having a wet chamber and a dry chamber, wherein said wet chamber is for thermally managing an electronic device by applying liquid coolant to an electronic device within said wet chamber;
    wherein said dry chamber abuts a sidewall of said chassis;
    wherein said wet chamber includes a coolant spray system for thermally managing an electronic device;
    wherein said dry chamber includes a coolant system fluidly connected to said coolant spray system;
    a dry access door removably attached about said dry chamber, wherein said dry access door completely seals said dry chamber; and
    a wet access door removably attached about said wet chamber, wherein said wet access door completely seals said wet chamber.

13. The spray cool system with a dry access chamber of claim 12, wherein said coolant spray system is comprised of components chosen from the group consisting of a spray unit, a sensor, a card cage, an intake valve and a condenser.

14. The spray cool system with a dry access chamber of claim 12, wherein said coolant system is fluidly connected to a spray unit positioned within said wet chamber.

15. The spray cool system with a dry access chamber of claim 12, wherein said coolant system is comprised of components chosen from the group consisting essentially of a filter, a pump, a heater, a sensor and a separator.

16. The spray cool system with a dry access chamber of claim 12, wherein said dry chamber is adjacent to said wet chamber within said chassis.

17. The spray cool system with a dry access chamber of claim 12, wherein said dry chamber is sealed from said wet chamber.

18. The spray cool system with a dry access chamber of claim 12 wherein said dry access door is movably or pivotally attached to said chassis.

19. A spray cool system with a dry access chamber, comprising:
   a chassis having a wet chamber and a dry chamber, wherein said wet chamber is for thermally managing an electronic device by applying liquid coolant to an electronic device within said wet chamber;
   wherein said dry chamber abuts a sidewall of said chassis;
   a dry access door removably attached about said dry chamber; and
   a wet access door removably attached about said wet chamber, wherein said wet access door is capable of sealing said wet chamber;
   wherein said wet access door is exposed externally of said dry chamber.

20. The spray cool system with a dry access chamber of claim 19, wherein said wet chamber includes a coolant spray system.

21. The spray cool system with a dry access chamber of claim 20, wherein said coolant spray system is comprised of components chosen from the group consisting of a spray unit, a sensor, a card cage, an intake valve and a condenser.

22. The spray cool system with a dry access chamber of claim 21, wherein said coolant spray system is fluidly connected to a coolant system positioned within said dry chamber.

23. The spray cool system with a dry access chamber of claim 19, wherein said dry chamber includes a coolant system fluidly connected to said wet chamber.

24. The spray cool system with a dry access chamber of claim 23, wherein said coolant system is fluidly connected to a spray unit positioned within said wet chamber.

25. The spray cool system with a dry access chamber of claim 23, wherein said coolant system is comprised of components chosen from the group consisting of a filter, a pump, a heater, a sensor and a separator.

26. The spray cool system with a dry access chamber of claim 19, wherein said dry chamber is adjacent to said wet chamber within said chassis.

27. The spray cool system with a dry access chamber of claim 19, wherein said dry chamber is sealed from said wet chamber.

* * * * *